US012665391B2

(12) United States Patent
He et al.

(10) Patent No.: US 12,665,391 B2
(45) Date of Patent: Jun. 23, 2026

(54) COMB LASER

(71) Applicant: Marvell Asia Pte Ltd, Singapore (SG)

(72) Inventors: Xiaoguang He, Diamond Bar, CA (US); Charles Chih-Chin Lin, Kanata (CA); Samira Karimelahi, Los Gatos, CA (US); Masaki Kato, Palo Alto, CA (US); Radhakrishnan Nagarajan, Santa Clara, CA (US)

(73) Assignee: Marvell Asia Pte Ltd, Singapore (SG)

( * ) Notice: Subject to any disclaimer, the term of this patent is extended or adjusted under 35 U.S.C. 154(b) by 506 days.

(21) Appl. No.: 18/366,705

(22) Filed: Aug. 8, 2023

(65) Prior Publication Data

US 2024/0235155 A1 Jul. 11, 2024

Related U.S. Application Data

(60) Provisional application No. 63/402,510, filed on Aug. 31, 2022, provisional application No. 63/396,646, filed on Aug. 10, 2022.

(51) Int. Cl.
H01S 5/14 (2006.01)
H01S 3/10 (2006.01)
(Continued)

(52) U.S. Cl.
CPC .......... H01S 5/142 (2013.01); H01S 3/10053 (2013.01); H01S 5/50 (2013.01); H01S 5/3013 (2013.01)

(58) Field of Classification Search
None
See application file for complete search history.

(56) References Cited

U.S. PATENT DOCUMENTS 7,773,642 B2 8/2010 Yamazaki
11,575,245 B2 2/2023 He et al.
(Continued)

FOREIGN PATENT DOCUMENTS

EP 3379663 A2 9/2018

OTHER PUBLICATIONS

El Shamy et al., "Modelling, Characterization, and Applications of Silicon on Insulator Loop Terminated Asymmetric Mach Zehnder Interferometer," natureportfolio, Scientific Reports, issue 12, article No. 3598, pp. 1-10, year 2022.
(Continued)

*Primary Examiner* — Kristy A Haupt
(74) *Attorney, Agent, or Firm* — Meitar Patents Ltd.; Daniel Kligler

(57) ABSTRACT

An optoelectronic device includes a reflective semiconductor optical amplifier (RSOA), which includes a gain medium to amplify laser radiation within a given gain band, a first reflector at a first end of the gain medium, and a waveguide coupled to convey the laser radiation into and out of a second end of the gain medium. An external laser cavity, disposed on an optical substrate, is optically coupled to the waveguide. The external laser cavity includes a second reflector, a comb filter, disposed between the second reflector and the RSOA and configured to pass a set of distinct wavelength sub-bands within the gain band, the set of distinct wavelength sub-bands defining a comb, and a bandpass filter between the second reflector and the RSOA in series with the comb filter, having a passband encompassing a subset of the wavelength sub-bands in the comb.

18 Claims, 3 Drawing Sheets

(51) Int. Cl.
    *H01S 5/30*          (2006.01)
    *H01S 5/50*          (2006.01)

(56)          References Cited

U.S. PATENT DOCUMENTS

| | | |
|---|---|---|
| 2014/0098412 A1 | 4/2014 | Welford |
| 2016/0139487 A1 | 5/2016 | Popovic et al. |
| 2018/0183202 A1 | 6/2018 | Kang |
| 2018/0269654 A1* | 9/2018 | Zhang ................... H01S 5/1096 |
| 2018/0302167 A1 | 10/2018 | Eggleston et al. |
| 2019/0181612 A1* | 6/2019 | Zhang ................. H01S 5/06804 |
| 2020/0144790 A1 | 5/2020 | Nagarajan et al. |
| 2021/0057880 A1 | 2/2021 | Mehta et al. |
| 2021/0203132 A1 | 7/2021 | Stern |
| 2021/0255394 A1 | 8/2021 | Hassan et al. |
| 2021/0273408 A1 | 9/2021 | He et al. |
| 2022/0255295 A1 | 8/2022 | He et al. |
| 2023/0341628 A1 | 10/2023 | Fini et al. |

OTHER PUBLICATIONS

EP Application # 23190826.0 Search Report dated Jan. 8, 2024.
Chen et al., "A Comb Laser-driven DWDM Silicon Photonic Transmitter Based on Microring Modulators," Optics Express, vol. 23, No. 16, pp. 1-8, Aug. 10, 2015.
Sun et al., "A 45 nm CMOS-SOI Monolithic Photonics Platform With Bit-Statistics-Based Resonant Microring Thermal Tuning,"
IEEE Journal of Solid-State Circuits, vol. 51, No. 4, pp. 893-907, Apr. 2016.
El Shamy Raghi et al: "Modelling, characterization, and applications of silicon on insulator loop terminated asymmetric Mach Zehnder interferometer", Scientific Reports, vol. 12, No. 1, pp. 3598-1, dated Mar. 4, 2022.
European Patent Office. Extended European Search Report for EP Application No. 24219867.9-1211 (Marvell Asia Pte Ltd). Munich, May 6, 2025.
Zhao Qiancheng et al: "Silicon Nitride on 6 Silicon-on-Insulator: a Platform for Integration Active Control over Passive Components", Conference on Lasers and Electro-Optics, [Online], Jan. 1, 2016, pp. 1-2.
European Search Report # 25151273.7, dated Jul. 30, 2025.
Zhang et al., "Quantum dot SOA/silicon external cavity multi-wavelength laser," Optics Express, vol. 23, No. 4, pp. 4666-4671, year 2015.
EP Application # 24191461.3 Search Report dated Jan. 22, 2025.
Zhao et al., "Hybrid Dual-gain Tunable Integrated InP—Si3N4 External Cavity Laser," Optics Express, vol. 29, No. 7, pp. 10958-10966, Mar. 29, 2021.
Orlandi et al., "Tunable Silicon Photonics Directional Coupler Driven by a Transverse Temperature Gradient," Optics Letters, vol. 38, No. 6, pp. 863-865, Mar. 15, 2013.
Rizzo et al., "Ultra-broadband Interleaver for Extreme Wavelength Scaling in Silicon Photonic Links," IEEE Photonics Technology Letters, vol. 33, No. 1, pp. 55-58, Jan. 1, 2021.
Ye et al., "Silicon Integrated Multi-mode Ring Resonator," Nanophotonics, vol. 10, No. 4, pp. 1265-1272, year 2021.

\* cited by examiner

COMB LASER

CROSS-REFERENCE TO RELATED APPLICATION

This application claims the benefit of U.S. Provisional Patent Application 63/396,646, filed Aug. 10, 2022, and of U.S. Provisional Patent Application 63/402,510, filed Aug. 31, 2022. Both of these related applications are incorporated herein by reference.

FIELD

The present invention relates generally to optoelectronic devices, and particularly to semiconductor lasers.

BACKGROUND

Wavelength domain multiplexing (WDM) is commonly used in high-speed optical communications to enable multiple communication signals with different carrier wavelengths to be transmitted over the same optical fiber. Some WDM devices use a single laser, emitting radiation at a comb of wavelengths, to provide carrier waves at multiple wavelengths simultaneously. The term "comb," as used in the present description and in the claims, refers to a set of distinct spectral sub-bands, having respective center wavelengths that are spaced apart by equal steps in wavelength. The term "comb filter" refers to an optical filter having a passband consisting of such a comb, such that the comb filter passes light having a wavelength in any of the distinct spectral sub-bands in the set while blocking wavelengths between the sub-bands in the set. The terms "light" and "optical radiation" are used synonymously in the present description and in the claims to refer to electromagnetic radiation in any of the infrared, visible, and ultraviolet spectral ranges.

For example, Zhang et al. describe a multi-wavelength laser in an article entitled "Quantum dot SOA/silicon external cavity multi-wavelength laser," published in *Optics Express* 23:4 (2015), pages 4666-4671. The device described in the article consists of a quantum dot reflective semiconductor optical amplifier and a silicon-on-insulator chip with a Sagnac loop mirror and microring wavelength filter. The authors showed four major lasing peaks from a single cavity.

SUMMARY

Some embodiments of the present invention that are described hereinbelow provide semiconductor laser devices that output optical radiation in a comb of wavelengths, as well as methods for producing and operating such devices.

There is therefore provided, in accordance with an embodiment of the invention, an optoelectronic device, which includes a reflective semiconductor optical amplifier (RSOA), including a gain medium configured to amplify laser radiation within a given gain band, a first reflector disposed at a first end of the gain medium, and a waveguide coupled to convey the laser radiation into and out of a second end of the gain medium, opposite the first end. An external laser cavity is disposed on the optical substrate and is optically coupled to the waveguide. The external laser cavity includes a second reflector, a comb filter, disposed between the second reflector and the RSOA and configured to pass a set of distinct wavelength sub-bands within the gain band, the set of distinct wavelength sub-bands defining a comb, and a bandpass filter, disposed between the second reflector and the RSOA in series with the comb filter, the bandpass filter having a passband encompassing a subset of the wavelength sub-bands in the comb.

In some embodiments, the RSOA includes a III-V semiconductor material, and the external laser cavity includes a silicon photonic integrated circuit (PIC). Additionally or alternatively, the external laser cavity includes a phase tuner disposed between the second reflector and the RSOA in series with the comb filter and the bandpass filter.

In some embodiments, the comb filter includes an optical ring resonator. Additionally or alternatively, the bandpass filter includes one or more optical ring resonators, each optical ring resonator among the one or more optical ring resonators configured to filter out a selected group of the wavelength sub-bands in the comb that are outside the passband. In a disclosed embodiment, the one or more optical ring resonators include multiple optical ring resonators having different, respective resonances, which are selected so that each of the optical ring resonators filters out a different, respective subset of the wavelength sub-bands that are outside the passband.

In the disclosed embodiments, the passband of the bandpass filter is narrower than the gain band of the gain medium.

There is also provided, in accordance with an embodiment of the invention, a method for generating radiation. The method includes providing a reflective semiconductor optical amplifier (RSOA), including a gain medium configured to amplify laser radiation within a given gain band and a first reflector disposed at a first end of the gain medium. The RSOA is optically coupled to an external laser cavity, which is disposed on an optical substrate and includes a second reflector and a comb filter disposed between the second reflector and the RSOA and configured to pass a set of distinct wavelength sub-bands within the gain band. The set of distinct wavelength sub-bands defines a comb. A bandpass filter is disposed between the second reflector and the RSOA in series with the comb filter. The bandpass filter has a passband encompassing a subset of the wavelength sub-bands in the comb. An electrical drive is applied to the RSOA, whereby the laser radiation in subset of the wavelength sub-bands in the comb is emitted through the second reflector.

There is additionally provided, in accordance with an embodiment of the invention, an integrated optical device, including an optical substrate and multiple optical ring resonators, which are disposed on the optical substrate and interconnected in series by waveguides. The optical ring resonators include a first optical ring resonator configured to pass a set of distinct wavelength sub-bands, the set of distinct wavelength sub-bands defining a comb, and one or more second optical ring resonators. Each second optical ring resonator among the one or more second optical ring resonators is configured to filter out a selected group of the wavelength sub-bands in the comb.

In some embodiments, the one or more second optical ring resonators include a plurality of the second optical ring resonators having different, respective resonant wavelengths, which are selected so that each of the second optical ring resonators filters out a different, respective subset of the wavelength sub-bands in the comb by destructive interference at the respective resonant wavelengths. In a disclosed embodiment, the respective resonant wavelengths of the second optical ring resonators are selected so as to define a bandpass filter that passes a specified set of the wavelength sub-bands in the comb while attenuating the wavelengths that are outside the specified set by destructive interference in the second optical ring resonators.

Additionally or alternatively, the first optical ring resonator includes a first resonant ring having a first length, which determines a spectral spacing of the wavelength sub-bands in the comb, and each of the second optical ring resonators includes a respective second resonant ring having a second length, which is an integer quotient of the first length.

The present invention will be more fully understood from the following detailed description of the embodiments thereof, taken together with the drawings in which:

DETAILED DESCRIPTION

Figures 1, 2:
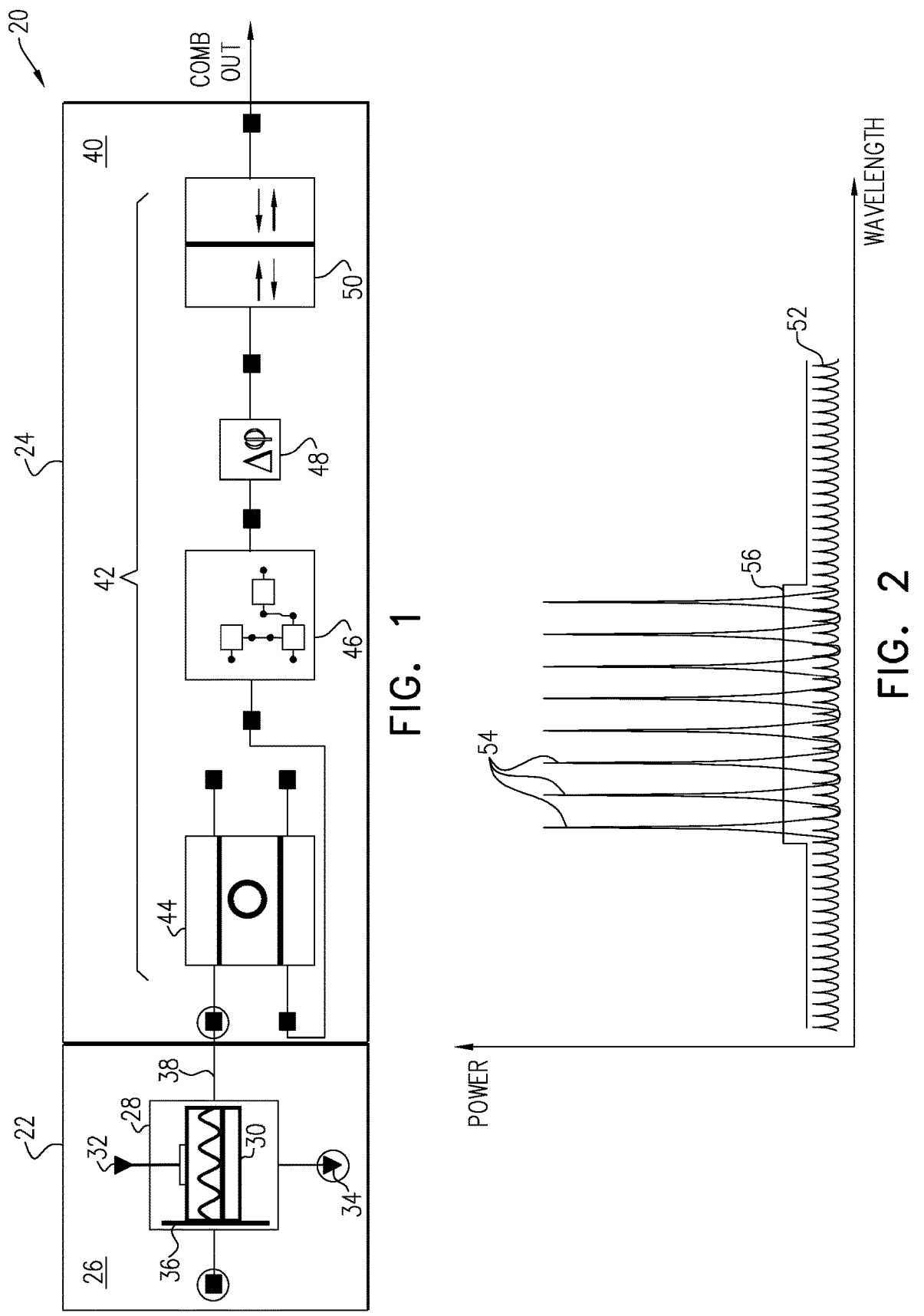
FIG. 1 is a block diagram that schematically illustrates a multi-wavelength laser device, in accordance with an embodiment of the invention.
FIG. 2 is a plot that schematically shows an output spectrum of the laser device of FIG. 1, in accordance with an embodiment of the invention.

Multi-wavelength semiconductor lasers that are used in WDM applications typically emit a dense comb of wavelength sub-bands over a wide spectral range. The density of the comb (i.e., the spacing between center wavelengths of the sub-bands) is determined by the laser cavity length, while the spectral range is limited mainly by the gain band of the optical gain medium in the laser. Additional filters external to the laser cavity are used to select the specific wavelength sub-bands to be used as carriers for the WDM channels and to cut off the remainder of the emission range of the laser. This approach is energy-inefficient, since much of the optical power output by the laser is discarded.

Embodiments of the present invention that are described herein use optical filters disposed in the laser cavity to select the desired comb of sub-bands, while suppressing laser activity outside these sub-bands. These embodiments are thus able to generate a comb of sub-bands with higher spectral purity and higher efficiency than lasers relying on external filtering.

Some of the present embodiments provide an optoelectronic device, comprising a reflective semiconductor optical amplifier (RSOA), which is coupled to an external laser cavity containing the intra-cavity filters. The RSOA typically comprises a III-V semiconductor chip, on which a gain medium is formed having a given gain band. A reflector is formed on the III-V semiconductor chip at one end of the gain medium, and a waveguide is formed at the other end to convey laser radiation into and out of the gain medium.

The external laser cavity is formed on an optical substrate, for example on a silicon photonic integrated circuit (PIC), and is optically coupled to the waveguide on the III-V semiconductor chip. The full laser cavity is thus defined by the optical path between the reflector at one end of the gain medium of the RSOA and a second reflector on the optical substrate at the opposite end of the external laser cavity. A comb filter is formed on the optical substrate between the second reflector and the RSOA. The comb filter is designed to pass a set of distinct wavelength sub-bands, defining a comb, within the gain band of the RSOA. A bandpass filter is also formed on the optical substrate between the second reflector and the RSOA, in series with the comb filter. The bandpass filter has a passband that encompasses the desired subset of the wavelength sub-bands in the comb. As noted above, the incorporation of the comb filter and the bandpass filter in the laser cavity results in efficient concentration of laser activity in the wavelengths within the desired subset of wavelength sub-bands.

The term "bandpass filter" is used in the present description and in the claims in its conventional sense, to mean a device that passes wavelengths within a certain range, referred to as the "passband" of the filter, and attenuates s wavelengths outside the passband. The difference in attenuation applied by the bandpass filter within and outside the passband can be large or small, depending on application requirements. Generally speaking, bandpass filters having passbands with steep, sharp edges and strong attenuation outside the passband are more difficult and costly to implement than bandpass filters with passband edges that slope gradually and only moderately attenuate radiation outside the passband. An advantage of incorporating the bandpass filter internally within the laser cavity in the present embodiments is that it achieves strong suppression of wavelengths outside the passband with only moderate attenuation by the filter.

In the embodiments that are described hereinbelow, the comb filter in the external laser cavity comprises an optical ring resonator. The resonator length is chosen to give a set of resonant wavelengths corresponding to the desired comb of wavelengths in the laser output. Such optical ring resonators can be fabricated compactly and precisely on a silicon-based optical substrate. Alternatively, other types of comb filters may be used.

In some embodiments, the bandpass filter also comprises one or more optical ring resonators, having respective lengths chosen to filter out a selected group of the wavelength sub-bands in the comb. In a disclosed embodiment, the bandpass filter comprises multiple optical ring resonators, having different, respective lengths and thus different resonant wavelengths. The configuration and resonant wavelengths of the optical ring resonators are selected so that each of the optical ring resonators filters out a different, respective subset of the wavelength sub-bands in the comb by destructive interference (at the respective resonant wavelengths). A bandpass filter with sharp edges and strong attenuation of the wavelength sub-bands outside the desired subset can be made by appropriate selection of the resonant wavelengths of the optical ring resonators.

FIG. 1 is a block diagram that schematically illustrates a multi-wavelength laser device 20, in accordance with an embodiment of the invention. Device 20 comprises an active optical chip 22 on a III-V semiconductor substrate 26, such as GaAs or InP, and a PIC 24 on an optical substrate 40, for example a silicon-on-insulator (SOI) substrate. For mechanical stability and compact packaging, chip 22 may be bonded to optical substrate 40, for example using a suitable adhesive. Alternatively, chip 22 and PIC 24 may be mounted separately and connected, for example, by a suitable optical fiber.

Chip 22 comprises an RSOA 28, comprising an optical gain medium 30, which amplifies laser radiation within a certain gain band, and a reflector 36 formed at the inner end of gain medium 30. Application of a drive voltage between electrodes 32 and 34 gives rise to optical gain in medium 30 across a certain gain band, for example over a band of several tens of nanometers centered at around 1310 nm or 1550 nm depending on the type of gain medium that is used. Gain medium 30 may comprise, for example, GaInAsP, AlGaInAs quantum wells, or InAs quantum dots, which emit light in these gain bands. Reflector 36 may comprise a distributed Bragg reflector (DBR), for example, or a reflective coating on the rear facet of the RSOA. A waveguide 38 on substrate 26 conveys laser radiation into and out of the RSOA at the end opposite reflector 36.

PIC 24 comprises an external laser cavity 42, which is optically coupled to waveguide 38 and terminates in a reflector 50. Reflector 50 is partially reflecting to allow the multi-wavelength laser beam that is generated by device 20 to exit from the cavity. Cavity 42 contains a comb filter 44 and a bandpass filter 46 in series, along with a phase tuner 48 for adjusting the cavity phase. Comb filter 44 in this embodiment comprises an optical ring resonator, with a ring length chosen so that filter 44 passes a comb of wavelength sub-bands within the gain band of RSOA 28. Thus, multi-wavelength laser device 20 can serve as a beam source for WDM communication applications, for example, with the wavelength spacing between the sub-bands in the comb set equal to the spacing between the WDM channels.

Bandpass filter 46 has a passband encompassing a subset of the wavelength sub-bands in the comb that is defined by comb filter 44. For example, the subset of sub-bands encompassed by the bandpass filter may correspond to the set of wavelengths of the WDM channels, while the remainder of the comb falls outside the passband. In other words, the passband of the bandpass filter encompasses the subset of wavelength sub-bands in the sense that the bandpass filter attenuates the wavelengths within this subset only minimally, while applying stronger attenuation to wavelengths outside the subset. Typically, the passband of bandpass filter 46 is narrower than the gain band of gain medium 30. Because bandpass filter 46 is contained in the laser cavity, only a weak attenuation (on the order of 1-10 dB) is needed to suppress laser activity at wavelengths outside the passband.

In an embodiment that is described below, with reference to FIG. 3, bandpass filter 46 comprises multiple optical ring resonators, having resonant wavelengths chosen to achieve the desired spectral response. Alternatively or additionally, bandpass filter 46 may comprise any other sort of filter that is suitable for implementation on PIC 24, such as an absorption filter or a diffractive filter.

FIG. 2 is a plot that schematically shows an output spectrum of laser device 20, in accordance with an embodiment of the invention. The spectrum comprises a comb of equally-spaced wavelength sub-bands 54, which are encompassed by a passband 56 of bandpass filter 46. For comparison, a reference spectrum 52 contains multiple closely-spaced lines, extending over the entire gain band of the laser. Intracavity comb filter 44 selects the (wider) spacing of sub-bands 54, while passband 56 suppresses the sub-bands that are outside the desired subset.

Figure 3:
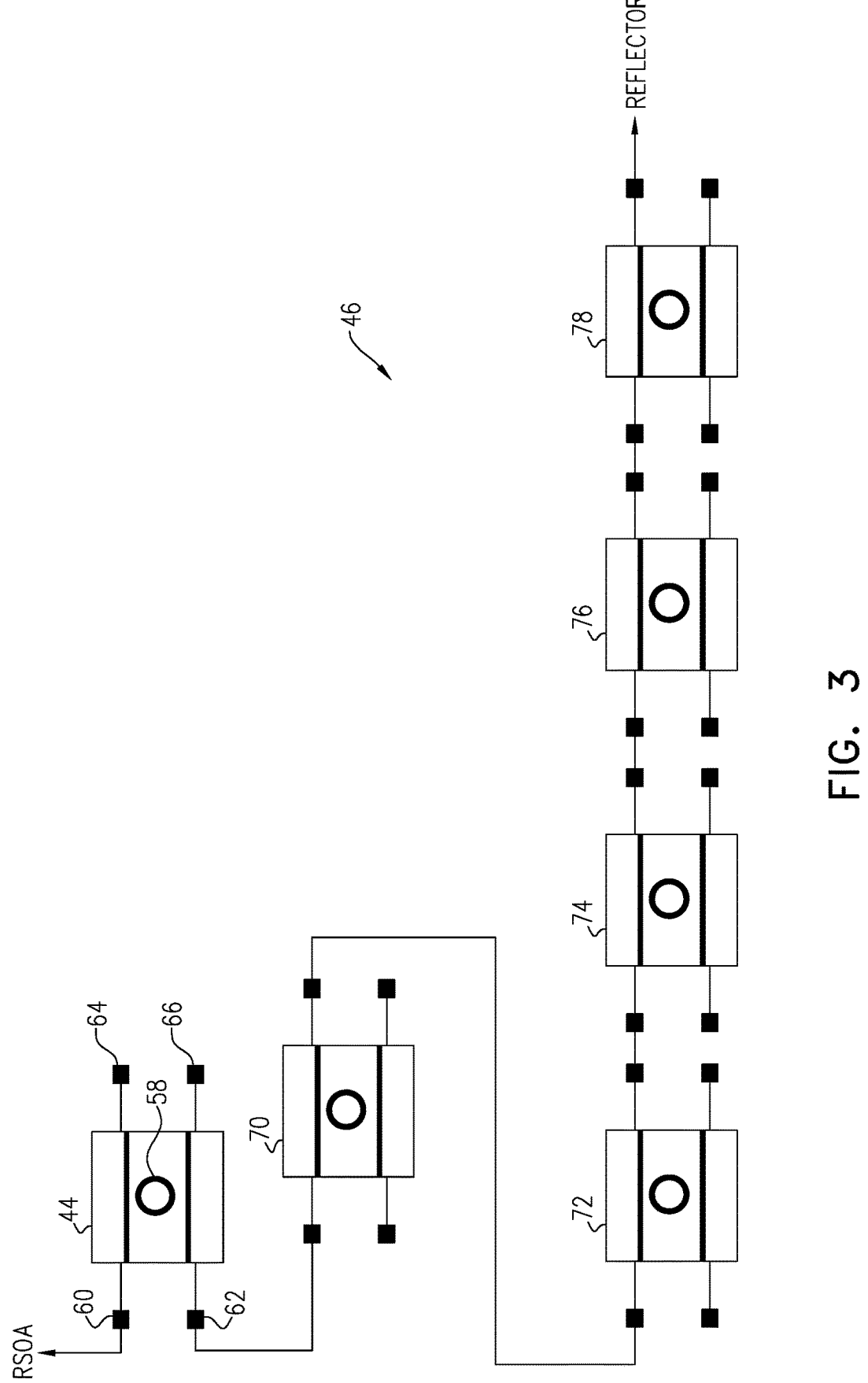
FIG. 3 is a block diagram that schematically shows details of an optical bandpass filter that can be used in the laser device of FIG. 1, in accordance with an embodiment of the invention.

FIG. 3 is a block diagram that schematically shows details of optical bandpass filter 46, in accordance with an embodiment of the invention. In the pictured example, bandpass filter 46 comprises five optical ring resonators 70, 72, 74, 76, and 78, arranged in series. These ring resonators may be of the same type as comb filter 44, but with different spectral properties. The optical ring resonators are fabricated, for example, by forming silicon waveguides of suitable shapes and lengths on substrate 40 of PIC 24.

Each optical ring resonator comprises a resonant ring 58 and four ports: a port 60 serving as an input and ports 62, 64, and 66 as outputs. Port 62 is referred to as a "drop port," while port 64 is referred to as a "pass port." When port 62 is used as the output port, as in comb filter 44, constructive interference on ring 58 causes the optical ring resonator to function as a bandpass filter over multiple sub-bands. When port 64 is used as the output port, as in ring resonators 70, 72, 74, 76, and 78, destructive interference on ring 58 causes the optical ring resonator to function as a notch filter, blocking multiple sub-bands.

The operation of each optical ring resonator depends on the length of resonant ring 58, which determines the spacing between the resonant wavelengths and hence the sub-bands that are passed or blocked. Specifically, the lengths of the resonant rings in optical ring resonators 70, 72, 74, 76, and 78 and integer quotients of the length of the resonant ring in comb filter 44, so that the spectral spacings between the resonant wavelengths of optical ring resonators 70, 72, 74, 76, and 78 are integer multiples of the comb spacing. In the present example, the length of the resonant ring in optical ring resonator 70 is 1/n times the length of the resonant ring in comb filter 44, with n=5, while the lengths of the resonant rings in optical ring resonators 72, 74, 76, and 78 is $\frac{1}{2}n$ times the length of the resonant ring in comb filter 44. Alternatively, other values of n and other arrangements of optical ring resonators may be used.

Figure 4A:
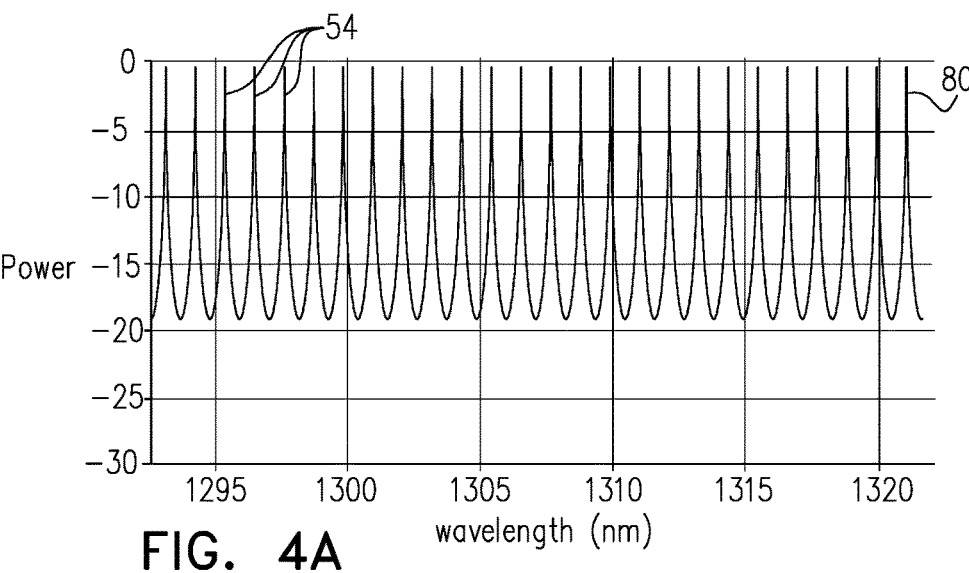
FIGS. 4A, 4B and 4C are spectral plots that schematically illustrate the operation of the optical bandpass filter of FIG. 3, in accordance with an embodiment of the invention.
Figure 4B:
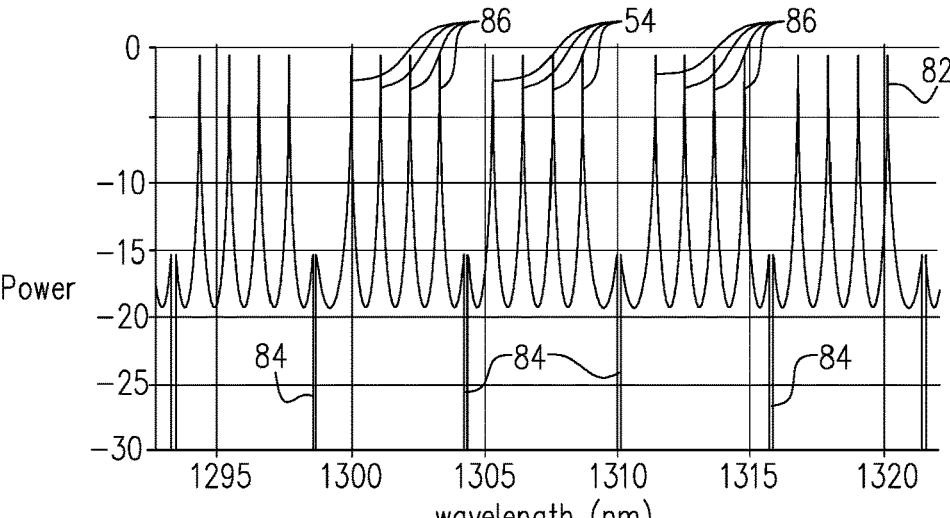
Figure 4C:
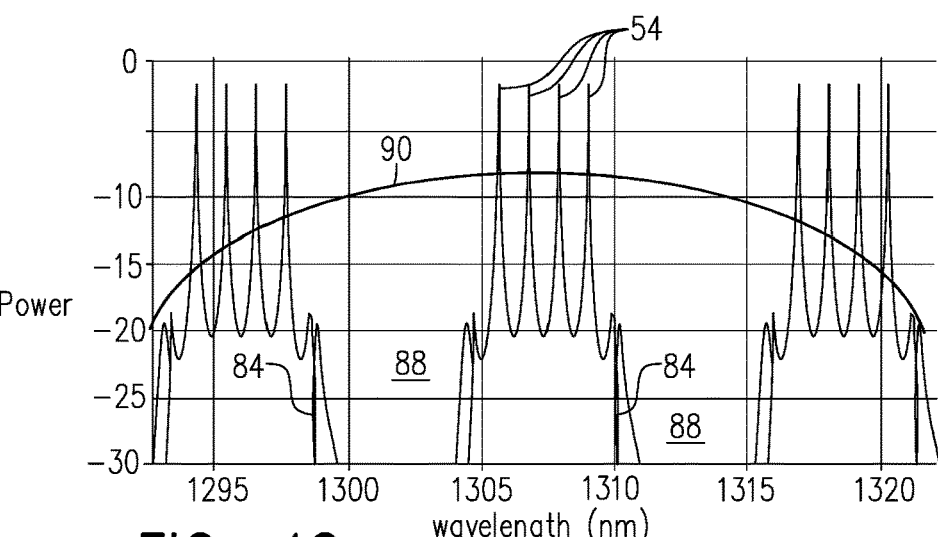

FIGS. 4A, 4B and 4C are spectral plots that schematically illustrate the operation of optical bandpass filter 46 as implemented in FIG. 3, in accordance with an embodiment of the invention. In this example, the gain band of gain medium 30 in RSOA 28 is assumed to extend over a range of a few tens of nanometers in the vicinity of 1310 nm.

FIG. 4A shows a multi-passband spectrum 80 of comb filter 44. Spectrum 80 comprises a comb of equally-spaced wavelength sub-bands 54, as noted above. The length of ring 58 in comb filter 44 is chosen to be about 400 μm, so that sub-bands are spaced apart by roughly 1 nm (assuming the ring has an effective refractive index $n_{eff}$=4.3 at the 1310 nm wavelength).

FIG. 4B shows a multi-passband spectrum 82, illustrating the effect of optical ring resonator 70 on spectrum 80. The length of ring 58 in optical ring resonator 70 is chosen to be about 80 μm, giving rise to notches 84 that overlap and thus attenuate every fifth sub-band 54 in spectrum 80. Notches 84 effectively separate spectrum 80 into subsets of sub-bands 54 and 86.

FIG. 4C shows the cumulative effect of optical ring resonators 72, 74, 76, and 78 on spectrum 82. The length bring of ring 58 in each of optical ring resonators 72, 74, 76, and 78 is chosen to be about 40 μm, giving rise to notches at wavelengths satisfying the formula $L_{ring}*n_{eff}$=mλ, overlapping every tenth sub-band of the comb in spectrum 82. The base wavelengths of the four optical ring resonators 72, 74, 76, and 78 are offset by one sub-band relative to one another (i.e., by about 1 nm), so that each of these optical resonators attenuates a different, respective group of sub-bands 86, spaced ten sub-bands apart. The base wavelengths of optical ring resonators 72, 74, 76, and 78 can be tuned to the desired offsets, for example, by heating the respective rings 58 to different temperatures, which changes their effective refractive indexes and thus shifts the resonant wavelengths. As a result, all of sub-bands 86 are suppressed, leaving stop-bands 88 on both sides of the selected subset of sub-bands 54.

Thus, the combined operation of optical ring resonators 70, 72, 74, 76, and 78 defines a passband of bandpass filter 46 that encompasses the four desired sub-bands 54 between 1305 and 1310 nm, while suppressing unwanted sub-bands

86. This passband is narrower than a gain band 90 of RSOA 28 and will thus cause laser device 20 to output optical radiation in the desired sub-bands 54. Although bandpass filter 46 itself may pass additional wavelength sub-bands in peripheral parts of spectrum 80, outside stop-bands 88, the gain of the RSOA is too low in these peripheral spectral ranges to support laser activity. Laser device 20 thus outputs a clean spectrum consisting of radiation only in sub-bands 54, and no additional external filtering of the multi-wavelength beam is required.

Although FIGS. 3 and 4A-C show a bandpass filter with a particular configuration of optical ring resonators and a particular spectral output, the principles of this embodiment may alternatively be applied in creating selective comb filters with other configurations, for example passing different numbers and arrangements of sub-bands. Such filters offer benefits of high spectral sensitivity and low optical loss in comparison with alternative solutions that are known in the art. In further alternative embodiments, a bandpass filter may comprise one or more optical ring resonators, configured as notch filters, in conjunction with filter components of other types, such as absorptive or diffractive components.

Thus, the embodiments described above are cited by way of example, and the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
  a reflective semiconductor optical amplifier (RSOA), comprising:
    a gain medium configured to amplify laser radiation within a given gain band;
    a first reflector disposed at a first end of the gain medium; and
    a waveguide coupled to convey the laser radiation into and out of a second end of the gain medium, opposite the first end;
  an optical substrate; and
  an external laser cavity, which is disposed on the optical substrate and is optically coupled to the waveguide, the external laser cavity comprising:
    a second reflector;
    a comb filter, disposed between the second reflector and the RSOA and configured to pass a set of distinct wavelength sub-bands within the gain band, the set of distinct wavelength sub-bands defining a comb; and
    a bandpass filter, disposed between the second reflector and the RSOA in series with the comb filter, the bandpass filter having a passband encompassing a subset of the wavelength sub-bands in the comb.

2. The device according to claim 1, wherein the RSOA comprises a III-V semiconductor material, and wherein the external laser cavity comprises a silicon photonic integrated circuit (PIC).

3. The device according to claim 1, wherein the external laser cavity comprises a phase tuner disposed between the second reflector and the RSOA in series with the comb filter and the bandpass filter.

4. The device according to claim 1, wherein the comb filter comprises an optical ring resonator.

5. The device according to claim 1, wherein the bandpass filter comprises one or more optical ring resonators, each optical ring resonator among the one or more optical ring resonators configured to filter out a selected group of the wavelength sub-bands in the comb that are outside the passband.

6. The device according to claim 5, wherein the one or more optical ring resonators comprise multiple optical ring resonators having different, respective resonances, which are selected so that each of the optical ring resonators filters out a different, respective subset of the wavelength sub-bands that are outside the passband.

7. The device according to claim 1, wherein the passband of the bandpass filter is narrower than the gain band of the gain medium.

8. A method for generating radiation, the method comprising:
  providing a reflective semiconductor optical amplifier (RSOA), comprising a gain medium configured to amplify laser radiation within a given gain band and a first reflector disposed at a first end of the gain medium;
  optically coupling the RSOA to an external laser cavity, which is disposed on an optical substrate and comprises a second reflector, a comb filter disposed between the second reflector and the RSOA and configured to pass a set of distinct wavelength sub-bands within the gain band, the set of distinct wavelength sub-bands defining a comb, and a bandpass filter, disposed between the second reflector and the RSOA in series with the comb filter, the bandpass filter having a passband encompassing a subset of the wavelength sub-bands in the comb; and
  applying an electrical drive to the RSOA, whereby the laser radiation in subset of the wavelength sub-bands in the comb is emitted through the second reflector.

9. The method according to claim 8, wherein providing the RSOA comprises forming the RSOA on a III-V semiconductor substrate, and wherein optically coupling the RSOA comprises coupling the RSOA via a waveguide to a silicon photonic integrated circuit (PIC).

10. The method according to claim 8, and comprising coupling a phase tuner between the second reflector and the RSOA in series with the comb filter and the bandpass filter.

11. The method according to claim 8, wherein optically coupling the RSOA comprises coupling an optical ring resonator to serve as the comb filter.

12. The method according to claim 8, wherein optically coupling the RSOA comprises coupling one or more optical ring resonators to constitute the bandpass filter, each optical ring resonator among the one or more optical ring resonators configured to filter out a selected group of the wavelength sub-bands in the comb that are outside the passband.

13. The method according to claim 12, wherein coupling the one or more optical ring resonators comprises coupling together multiple optical ring resonators having different, respective resonances, which are selected so that each of the optical ring resonators filters out a different, respective subset of the wavelength sub-bands that are outside the passband.

14. The method according to claim 8, wherein optically coupling the RSOA comprises setting the passband of the bandpass filter to be narrower than the gain band of the gain medium.

15. An integrated optical device, comprising:
  an optical substrate; and multiple optical ring resonators, which are disposed on the optical substrate and interconnected in series by waveguides, and which comprise:

a first optical ring resonator, configured to pass a set of distinct wavelength sub-bands, the set of distinct wavelength sub-bands defining a comb; and one or more second optical ring resonators, each second optical ring resonator among the one or more second optical ring resonators configured to filter out a selected group of the wavelength sub-bands in the comb.

16. The device according to claim 15, wherein the one or more second optical ring resonators comprise a plurality of the second optical ring resonators having different, respective resonant wavelengths, which are selected so that each of the second optical ring resonators filters out a different, respective subset of the wavelength sub-bands in the comb by destructive interference at the respective resonant wavelengths.

17. The device according to claim 16, wherein the respective resonant wavelengths of the second optical ring resonators are selected so as to define a bandpass filter that passes a specified set of the wavelength sub-bands in the comb while attenuating the wavelengths that are outside the specified set by destructive interference in the second optical ring resonators.

18. The device according to claim 16, wherein the first optical ring resonator comprises a first resonant ring having a first length, which determines a spectral spacing of the wavelength sub-bands in the comb, and wherein each of the second optical ring resonators comprises a respective second resonant ring having a second length, which is an integer quotient of the first length.

\* \* \* \* \*